(12) United States Patent
Maeda

(10) Patent No.: US 12,435,410 B2
(45) Date of Patent: Oct. 7, 2025

(54) SUBSTRATE PROCESSING SYSTEM AND SUBSTRATE PROCESSING METHOD

(71) Applicant: TOKYO ELECTRON LIMITED, Tokyo (JP)

(72) Inventor: Koji Maeda, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 410 days.

(21) Appl. No.: 17/631,855

(22) PCT Filed: Jul. 2, 2020

(86) PCT No.: PCT/JP2020/026069
§ 371 (c)(1),
(2) Date: Jan. 31, 2022

(87) PCT Pub. No.: WO2021/024659
PCT Pub. Date: Feb. 11, 2021

(65) Prior Publication Data
US 2022/0319819 A1 Oct. 6, 2022

(30) Foreign Application Priority Data

Aug. 8, 2019 (JP) .................................. 2019-146683

(51) Int. Cl.
*C23C 14/56* (2006.01)
*C23C 14/06* (2006.01)
(Continued)

(52) U.S. Cl.
CPC ............ *C23C 14/568* (2013.01); *C23C 14/06* (2013.01); *C23C 14/351* (2013.01); *C23C 14/50* (2013.01);
(Continued)

(58) Field of Classification Search
CPC ............. H01J 37/3452; H01J 37/32899; H01J 37/32743; H01J 37/32733; C23C 14/06;
(Continued)

(56) References Cited

U.S. PATENT DOCUMENTS

| 4,917,556 A | 4/1990 | Stark et al. |
| 5,934,856 A * | 8/1999 | Asakawa ................ F16K 51/02 414/217 |

(Continued)

FOREIGN PATENT DOCUMENTS

| JP | 2002324829 A | 11/2002 |
| JP | 2007-251090 A | 9/2007 |

(Continued)

OTHER PUBLICATIONS

PCT International Search Report and Written Opinion, PCT Application No. PCT/JP2020/026069, Sep. 24, 2020, 9 pages (with English translation of International Search Report).

*Primary Examiner* — Michael A Band
(74) *Attorney, Agent, or Firm* — Fenwick & West LLP

(57) ABSTRACT

There is provided a substrate processing system comprising: a plurality of transfer modules having transfer mechanisms configured to transfer substrates; and a plurality of process modules connected to the plurality of transfer modules. The transfer mechanisms of the plurality of transfer modules transfer a plurality of substrates sequentially and serially to the plurality of process modules, and each of the plurality of transfer modules has an aligner configured to align a substrate when transferring the substrate to the process module connected to a relevant transfer module.

8 Claims, 8 Drawing Sheets

(51) Int. Cl.
  *C23C 14/35* (2006.01)
  *C23C 14/50* (2006.01)
  *G11B 5/85* (2006.01)
  *H01J 37/32* (2006.01)
  *H01J 37/34* (2006.01)
  *H01L 21/67* (2006.01)
  *H01L 21/677* (2006.01)

(52) U.S. Cl.
  CPC .......... *G11B 5/85* (2013.01); *H01J 37/32733* (2013.01); *H01J 37/32743* (2013.01); *H01J 37/32899* (2013.01); *H01J 37/3452* (2013.01); *H01L 21/67184* (2013.01); *H01L 21/67742* (2013.01)

(58) Field of Classification Search
  CPC ..... C23C 14/351; C23C 14/50; C23C 14/505; C23C 14/568
  See application file for complete search history.

(56) References Cited

U.S. PATENT DOCUMENTS

| | | | |
|---|---|---|---|
| 8,246,798 B2* | 8/2012 | Hosoya | H10N 50/01 |
| | | | 156/345.46 |
| 10,049,860 B2* | 8/2018 | Gomi | C23C 14/566 |
| 10,468,237 B2* | 11/2019 | Gomi | H01J 37/32733 |
| 2007/0113977 A1 | 5/2007 | Hongo et al. | |
| 2012/0103254 A1 | 5/2012 | Sushihara | |
| 2015/0235815 A1* | 8/2015 | Gomi | H01J 37/32733 |
| | | | 204/298.27 |

FOREIGN PATENT DOCUMENTS

| | | |
|---|---|---|
| JP | 2012-222289 A | 11/2012 |
| JP | 2017-103415 A | 6/2017 |
| JP | 6160614 B2 | 7/2017 |
| WO | WO 2014/006804 A1 | 1/2014 |

* cited by examiner

SUBSTRATE PROCESSING SYSTEM AND SUBSTRATE PROCESSING METHOD

TECHNICAL FIELD

The present disclosure relates to a substrate processing system and a substrate processing method.

BACKGROUND

As a processing apparatus for performing a plurality of processes on a substrate, there is known a processing apparatus including a transfer part in which multiple transfer modules, each having a substrate transfer device, are arranged in one row and a plurality of process modules arranged on both sides of transfer chambers and configured to transfer substrates sequentially and serially in a U shape and perform a series of processes (see, e.g., Patent Document 1).

In addition, there is suggested a technique for detecting a direction of a notch of a substrate (object to be processed) using an aligner disposed in an atmospheric transfer chamber and performing pre-alignment of the substrate before substrates are sequentially and serially transferred to multiple process modules and processed (see, e.g., Patent Document 2).

PRIOR ART DOCUMENTS

Patent Documents

Patent Document 1: Japanese Patent Publication No. 6160614
Patent Document 2: Japanese Laid-open Patent Publication No. 2017-103415

SUMMARY

Problems to be Resolved by the Invention

The present disclosure provides a substrate processing system and a substrate processing method capable of maintaining a high productivity even when a substrate is aligned whenever the substrate is transferred to each of a plurality of process modules connected to a plurality of transfer modules in the case of serially transferring a plurality of substrates to the process modules and processing them.

Means of Solving the Problems

In accordance with an aspect of the present disclosure, there is provided a substrate processing system including a plurality of transfer modules having transfer mechanisms for transferring substrates, and a plurality of process modules connected to the plurality of transfer modules. The transfer mechanisms of the plurality of transfer modules transfer a plurality of substrates sequentially and serially to the plurality of process modules. Each of the plurality of transfer modules has an aligner for aligning a substrate when transferring the same to the process module connected to the relevant transfer module.

Effect of the Invention

In accordance with the present disclosure, there are provided a substrate processing system and a substrate processing method capable of maintaining a high productivity even when a substrate is aligned whenever the substrate is transferred to each of a plurality of process modules connected to a plurality of transfer modules in the case of serially transferring a plurality of substrates to the process modules and processing them.

DETAILED DESCRIPTION

Hereinafter, embodiments will be described with reference to the accompanying drawings.

First Embodiment

First, a first embodiment will be described.
(Substrate Processing System)

Figure 1:
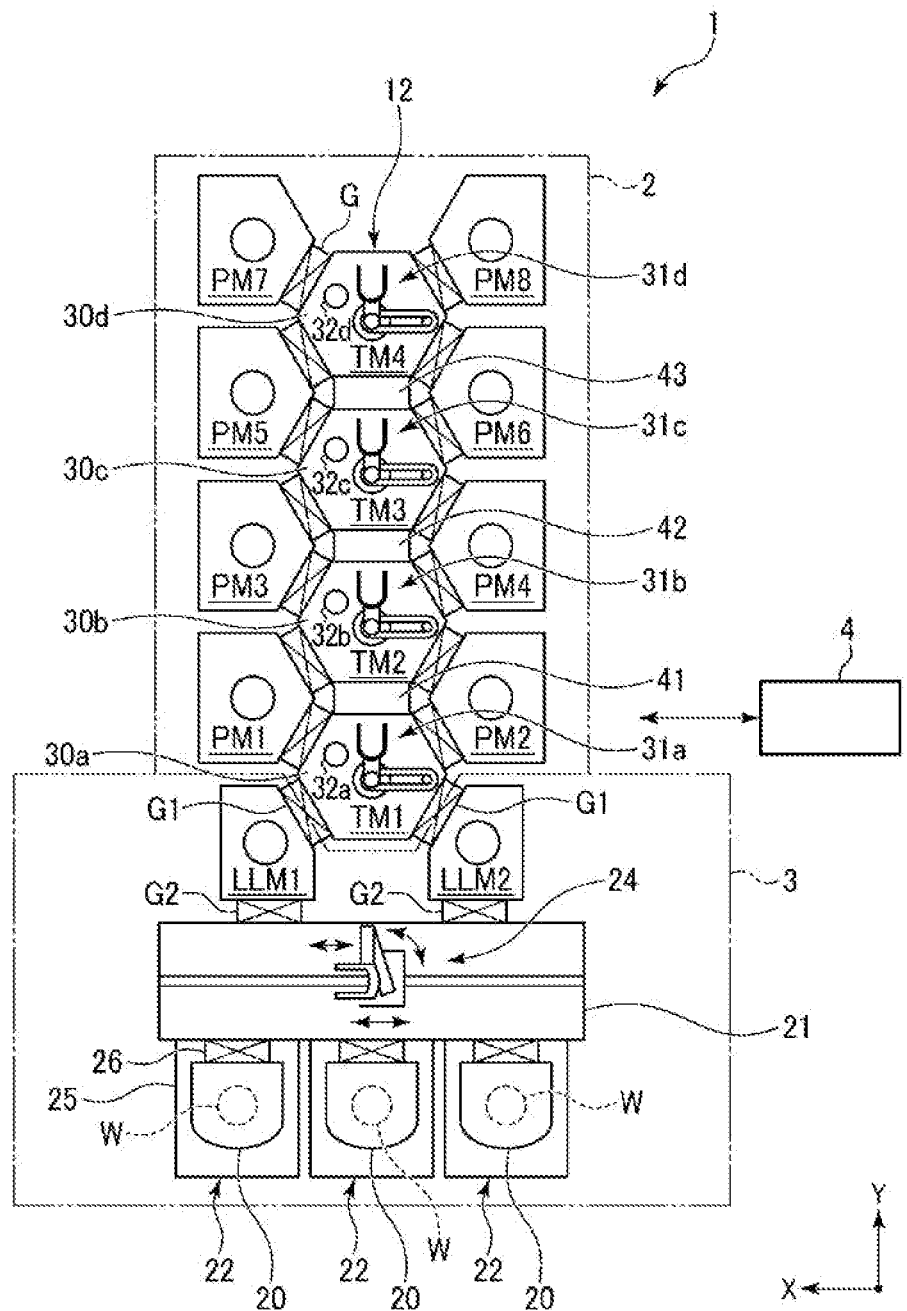
FIG. 1 is a plan view schematically showing a substrate processing system according to a first embodiment.

FIG. 1 is a plan view schematically showing a substrate processing system according to the first embodiment.

The substrate processing system 1 performs a plurality of processes on a substrate, and includes a processing part 2, a loading/unloading part 3 for holding a plurality of substrates and loading/unloading a substrate to/from the processing part 2, and a controller 4. The substrate is not particularly limited, but is a semiconductor wafer (hereinafter, simply referred to as "wafer"), for example.

The processing part 2 includes a plurality of (eight in this example) process modules PM1 to PM8 for performing predetermined vacuum processing on substrates W, and a transfer part 12 having a plurality of transfer modules TM1 to TM4 for sequentially transferring substrates W to the process modules PM1 to PM8.

The transfer modules TM1, TM2, TM3, and TM4 have containers 30a, 30b, 30c, 30d having a hexagonal planar shape and maintained in a vacuum state, and transfer mechanisms 31a, 31b, 31c, and 31d disposed in the containers, respectively. Delivery parts 41, 42, and 43 as transfer buffers are disposed between the transfer mechanisms of the transfer modules TM1 and TM2, between the transfer mechanisms of the transfer modules TM2 and TM3, and between the transfer mechanisms of the transfer modules TM3 and TM4, respectively. The containers 30a, 30b, 30c, and 30d of the transfer modules TM1 to TM4 communicate with each other.

In the transfer part 12, the transfer modules TM1 to TM4 are arranged in one row in the Y direction in the drawing, and four of the process modules PM1 to PM8 are connected to each of two sides of the transfer part 12 through gate valves G that can be opened and closed. The gate valves G of the process modules PM1 to PM8 are opened when the transfer mechanism of the transfer module accesses the process modules, and are closed during processing.

The loading/unloading part 3 is connected to one end of the processing part 2. The loading/unloading part 3 includes an atmospheric transfer chamber (EFEM) 21, three load ports 22 connected to the atmospheric transfer chamber 21, two load-lock modules LLM1 and LLM2, and a transfer device 24 disposed in the atmospheric transfer chamber 21.

The atmosphere transfer chamber 21 has a rectangular parallelepiped shape with the X direction as a longitudinal direction in the drawing. The three load ports 22 are disposed at a long sidewall of the atmospheric transfer chamber 21 opposite to a sidewall facing the processing part 2. Each load port 22 has a placement table 25 and a transfer port 26. A front opening unified pod (FOUP) 20 that is a wafer storage container accommodating a plurality of wafers is placed on the placement table 25, and the FOUP 20 on the placement table 25 is connected in a sealed state to the atmospheric transfer chamber 21 through the transfer port 26.

The two load-lock modules LLM1 and LLM2 allow wafers W to be transferred between the atmospheric transfer chamber 21 maintained at an atmospheric pressure and the transfer part 12 maintained at a vacuum atmosphere, and a pressure in each of the load-lock modules LLM1 and LLM2 is variable between an atmospheric pressure and a vacuum level similar to that in the transfer part 12. Each of the two load-lock modules LLM1 and LLM2 has two transfer ports. One of the two transfer ports is connected to the long sidewall of the atmospheric transfer chamber 21 facing the processing part 2 through a gate valve G2. The other transfer port is connected to the transfer part 12 of the processing part 2 through the gate valve G1.

The load-lock module LLM1 is used when the wafer W is transferred from the loading/unloading part 3 to the processing part 2, and the load-lock module LLM2 is used when the wafer W is transferred from the processing part 2 to the loading/unloading part 3. Further, processing such as degassing or the like may be performed in the load-lock modules LLM1 and LLM2.

The transfer device 24 in the atmospheric transfer chamber 21 has, e.g., an articulated structure, and transfers wafers W to the FOUP 20 on the load port 22 and the load-lock modules LLM1 and LLM2. Specifically, the transfer device 24 takes out an unprocessed wafer W from the FOUP 20 of the load port 22 and transfers the wafer W to the load-lock module LLM1. Further, the transfer device 24 receives a processed wafer W transferred from the processing part 2 to the load-lock module LLM2 and transfers the wafer W to the FOUP 20 of the load port 22.

In the processing part 2, the process modules PM1, PM3, PM5, and PM7 are arranged on one side of the transfer part 12 in that order from the load-lock module LLM1 side, and the process modules PM2, PM4, PM6, and PM8 are arranged on another side of the transfer part 12 in that order from the load-lock module LLM2 side. Further, in the transfer part 12, the transfer modules TM1, TM2, TM3, and TM4 are arranged in that order from the load-lock modules LLM1 and LLM2 side.

Further, aligners 32a, 32b, 32c, and 32d for aligning substrates W are disposed in the containers 30a, 30b, 30c, and 30d of the transfer modules TM1, TM2, TM3, and TM4, respectively. The aligners 32a, 32b, 32c, and 32d are disposed near loading ports of the process modules PM1, PM3, PM5, and PM7 through which the substrates W are transferred by the transfer mechanisms 31a, 31b, 31c, and 31d, respectively.

The transfer mechanism 31a of the transfer module TM1 is accessible to the load-lock modules LLM1 and LLM2, the process modules PM1 and PM2, the delivery part 41, and the aligner 32a. The transfer mechanism 31b of the transfer module TM2 is accessible to the process modules PM1, PM2, PM3, and PM4, the delivery parts 41 and 42, and the aligner 32b. The transfer mechanism 31c of the transfer module TM3 is accessible to the process modules PM3, PM4, PM5, and PM6, the delivery parts 42 and 43, and the aligner 32c. The transfer mechanism 31d of the transfer module TM4 is accessible to the process modules PM5, PM6, PM7, and PM8, the delivery part 43, and the aligner 32d.

Since the transfer device 24 and the transfer modules TM1 to TM4 of the transfer part 12 are configured as described above, the substrates W taken out from the FOUP 20 are serially transferred in one direction along a substantially U-shaped path in the order of the process modules PM1, PM3, PM5, PM7, PM8, PM6, PM4, and PM2, processed in the respective process modules in the processing part 2, and returned to the FOUP 20.

The controller 4 controls individual components of the substrate processing system 1, such as the transfer modules TM1 to TM4 (transfer mechanisms 31a to 31d), the transfer device 24, the process modules PM1 to PM8, the load-lock modules LLM1 and LLM2, the transfer part 12, the gate valves G, G1, and G2, and the like. The controller 4 is a computer, and includes a main controller having a CPU, an input device, an output device, a display device, and a storage device. The storage device is provided with a storage medium in which processing recipes are stored. The main controller causes the substrate processing system 1 to execute a predetermined operation based on the processing recipe retrieved from the storage medium.

The substrate processing system 1 may be desirably used for manufacturing a multilayer film including a plurality of magnetic films. A hard disk drive (HDD) head may be an example of a product that requires such a multilayer film. In the case of forming a plurality of magnetic films, it may be necessary to control a notch angle of the substrate W and a magnetization direction for each magnetic film.

(Process Module)

Next, the process module will be described.

Figure 2:
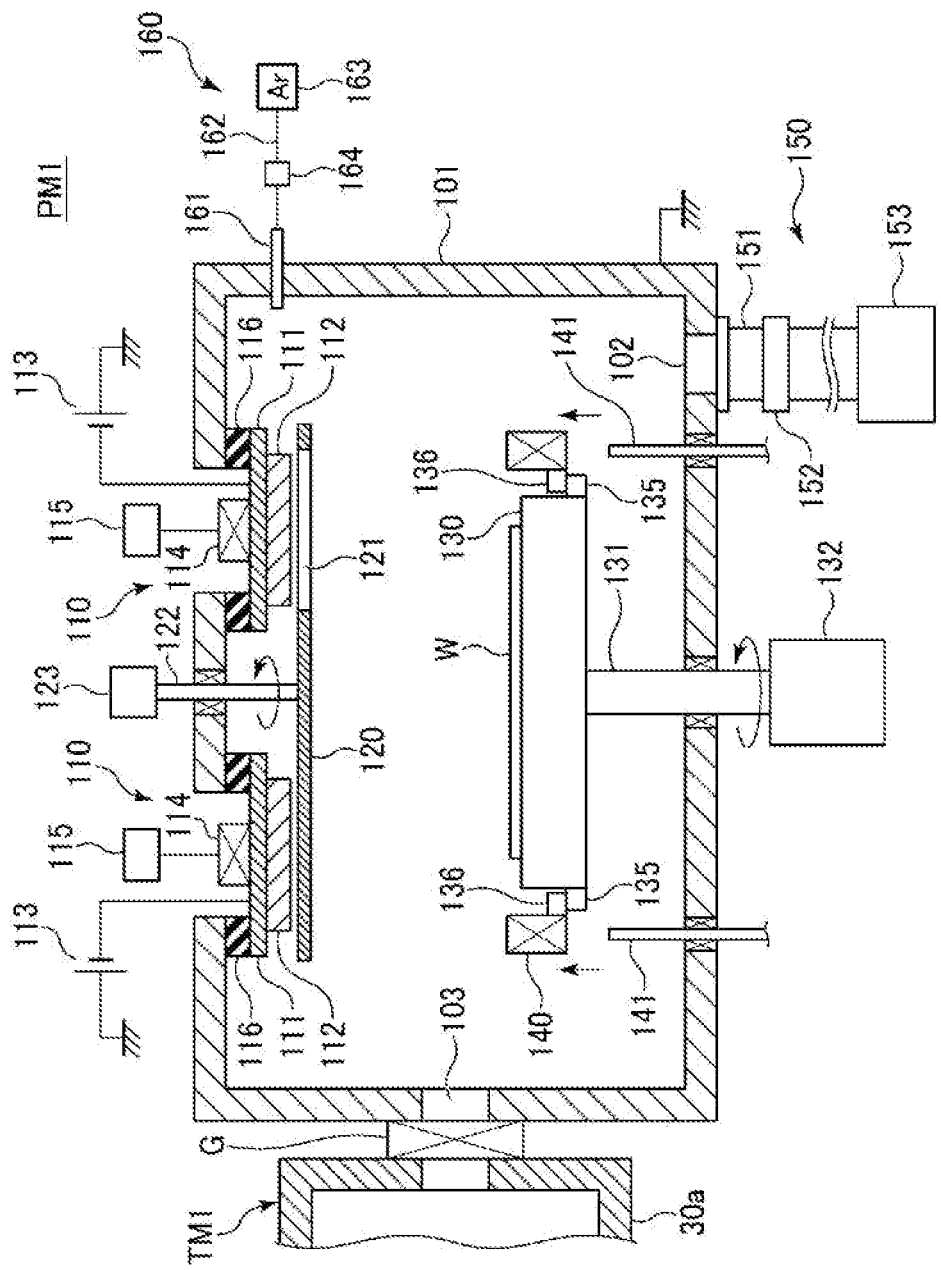
FIG. 2 is a cross-sectional view showing a schematic configuration of an example of a process module attached to the substrate processing system of FIG. 1.

FIG. 2 is a cross-sectional view showing a schematic configuration of an example of the process module PM1. The process modules PM2 to PM8 may have the same configuration as that of the process module PM1.

As shown in FIG. 2, the process module PM1 includes a processing chamber 101 made of a metal such as aluminum or stainless steel. The processing chamber 101 is grounded.

At a ceiling portion of the processing chamber 101, multiple cathode units 110 are arranged concentrically with respect to the center of the ceiling portion. The number of the cathode units 110 is not particularly limited as long as it is plural. For example, four cathode units 110 may be provided. The cathode unit 110 includes a target electrode 111, a target 112, a power supply 113, and a cathode magnet 114.

The target electrode 111 functions as a cathode electrode and is attached to the ceiling portion of the processing chamber 101 via an insulating member 116. The target electrode 111 holds the target 112. The target 112 is made of a material forming a film to be deposited, and is made of a magnetic material, a non-magnetic material, or an insulating material. The targets 112 may be made of the same material or may be made of different materials. The power supply 113 is, e.g., a DC power supply, and applies a negative DC voltage to the target electrode 111. The power supply 113 may be an AC power supply.

The cathode magnet 114 is disposed on an upper surface of the target electrode 111, and a magnet driving part 115 is connected to the cathode magnet 114.

A shutter 120 is disposed directly under the multiple cathode units 110. The shutter 120 has a disc shape having a size that covers a projection area of the targets 112, and is rotatable about a rotation shaft 122 disposed at the center of the ceiling portion. The rotation shaft 122 is connected to a rotation mechanism 123 disposed above the processing chamber, and the shutter 120 is rotated by the rotation mechanism 123. The shutter 120 has an opening 121 that is slightly greater than the target 112. The opening 121 corresponds to the target 112 to be used, and the other targets 112 are shielded by the shutter 120.

A substrate holder 130 for horizontally holding the substrate W is disposed in a lower region of the processing chamber 101 to face the cathode units 110. The substrate holder 130 is provided with a substantially disc-shaped electrostatic chuck (not shown) for attracting and holding the substrate W and a temperature controller (not shown) for controlling a temperature of the substrate W. Further, the substrate holder 130 is provided with three elevating pins (not shown) that can protrude and retract with respect to the upper surface of the substrate holder 130, so that the substrate W can be transferred to the substrate holder 130.

A support shaft 131 extends downward from the center of a bottom surface of the substrate holder 130 to penetrate through the processing chamber 101, and is connected to a driving mechanism 132 under the processing chamber 101. The driving mechanism 132 is configured to rotate and vertically move the substrate holder 130 via the support shaft 131. A space between the support shaft 131 and a bottom wall of the processing chamber 101 is sealed by a magnetic fluid seal or the like.

Figure 3:
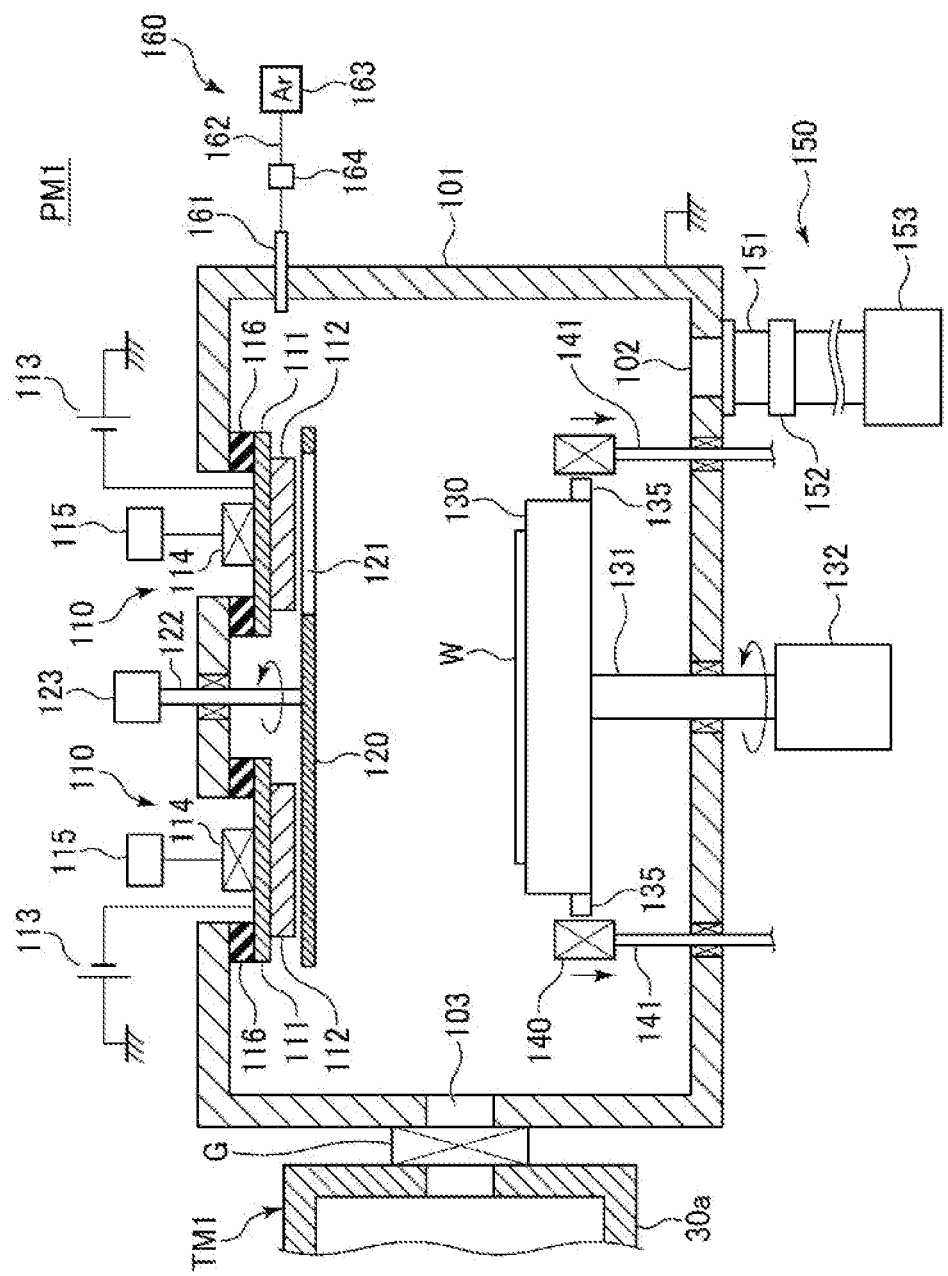
FIG. 3 is a cross-sectional view showing a position of a substrate holder at the time of forming a non-magnetic film in the process module of FIG. 2.

A ring magnet 140 for applying a magnetic field to the substrate W is disposed around the substrate holder 130. The ring magnet 140 is configured to apply a magnetic field to the notch of the substrate W at an arbitrary angle. A magnet support 135 is disposed around the substrate holder 130. An inwardly protruding protrusion 136 is formed at a lower end of an inner circumference of the ring magnet 140. Further, the ring magnet 140 can be supported by a support shaft 141, and can be vertically moved by the support shaft 141. The ring magnet 140 can be placed on the substrate holder 130 by aligning the positions of the magnet support 135 and the protrusion 136 by rotating the substrate holder 130. In the case of forming a magnetic film, as shown in FIG. 2, in a state where the ring magnet 140 is placed on the substrate holder 130, the support shaft 141 is lowered to separate the ring magnet 140 and the support shaft 141. In that case, the ring magnet 140 is located at a height position corresponding to the substrate W held by the substrate holder 130. The direction of the magnetic field of the ring magnet 140 at this time is adjusted in advance to form a specific angle with respect to the notch of the substrate W. Since the ring magnet 140 is placed on the substrate holder 130, the ring magnet 140 rotates together with the substrate holder 130. In the case of forming a non-magnetic film, as shown in FIG. 3, the ring magnet 140 is separated from the substrate holder 130 by misaligning the positions of the magnet support 135 and the protrusion 136. Then, the ring magnet 140 is supported by the support shaft 141, and the ring magnet 140 is lowered with respect to the substrate holder 130 to prevent the magnetic field from being applied to the substrate W. Accordingly, it is possible to prevent the magnetic field from adversely affecting the film formation of the non-magnetic film. The substrate holder 130 is also raised from the ring magnet 140 when the substrate W is loaded and unloaded.

An exhaust 150 is disposed at the bottom portion of the processing chamber 101. The exhaust 150 includes an exhaust line 151 connected to an exhaust port 102 formed at the bottom portion of the processing chamber 101, a pressure control valve 152, and a vacuum pump 153. The vacuum pump 153 exhausts the inside of the processing chamber 101 through the exhaust line 151. Further, the pressure control valve 152 is disposed in the exhaust line 151 to control a pressure in the processing chamber 101.

A loading/unloading port 103 for loading/unloading the substrate W is disposed on the sidewall of the processing chamber. The loading/unloading port 103 is opened and closed by the above-described gate valve G.

A gas supplier 160 is disposed at an upper portion of the sidewall of the processing chamber 101. The gas supplier 160 includes a gas inlet nozzle 161, a gas supply line 162, and a gas supply source 163. A noble gas, e.g., Ar, Ne, Kr, or the like (Ar in the example of FIG. 2), is supplied as a plasma generation gas from the gas supply source 163 into the processing chamber 101 through the gas supply line 162 and the gas inlet nozzle 161. A gas control device group 164, e.g., a valve, a flow rate controller such as a mass flow controller, or the like is disposed in the gas supply line 162.

(Transfer Module)

Next, the transfer module will be described.

Figure 4:
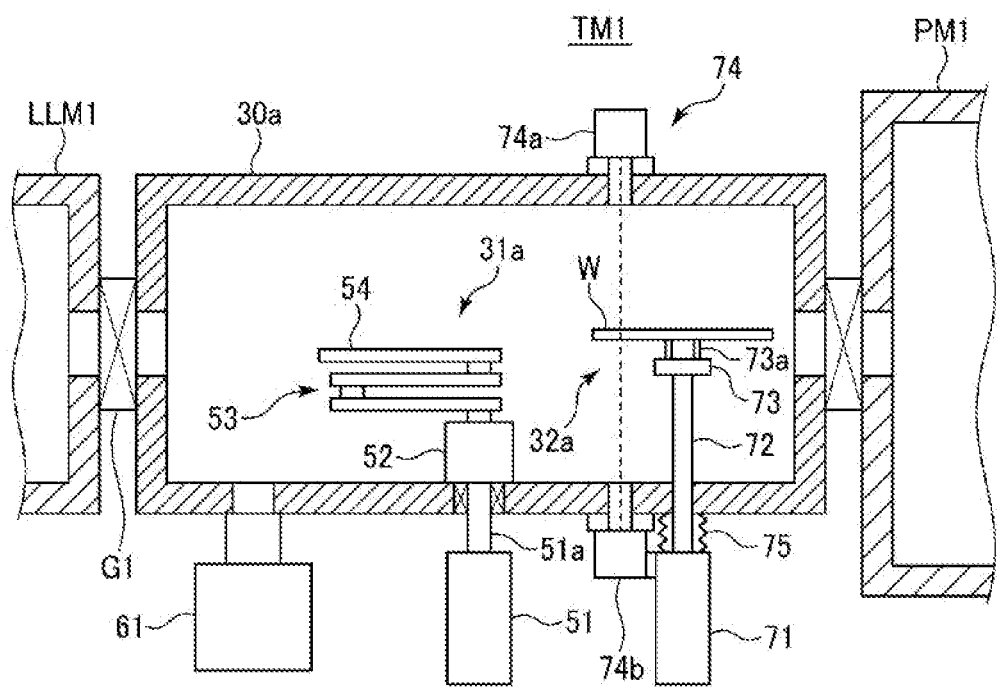
FIG. 4 is a cross-sectional view showing a schematic configuration of a transfer module attached to the substrate processing system of FIG. 1.

FIG. 4 is a cross-sectional view showing a schematic configuration of the transfer module TM1. The transfer modules TM2 to TM4 basically have the same configuration as that of the transfer module TM1.

As shown in FIG. 4, the transfer module TM1 includes the container 30a, the transfer mechanism 31a, the aligner 32a, and an exhaust mechanism 61.

The exhaust mechanism 61 exhausts the inside of the container 30a to set a pressure in the container 30a to a predetermined vacuum level.

The transfer mechanism 31a has a driving mechanism 51, a base portion 52, a rotatable and extensible/contractible portion 53, and a substrate support arm 54.

The driving mechanism 51 is disposed below the container 30a and configured to rotate a driving shaft 51a. The base portion 52 is fixed to the center of the bottom portion in the container 30a, and the driving shaft 51a is inserted into the base portion 52.

Figure 5:
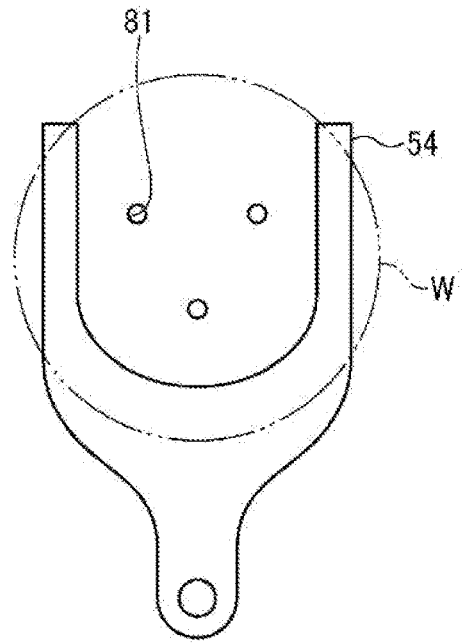
FIG. 5 is a plan view showing a substrate support arm of a transfer mechanism disposed in the transfer module.

The rotatable and extensible/contractible portion 53 has an articulated structure that is rotatable and extensible/contractible by the driving mechanism 51. The substrate support arm 54 supports and delivers the substrate W. As shown in FIG. 5, the substrate support arm 54 has a U shape and, thus, the substrate W can be delivered to a destination while avoiding the substrate support pins 81. Further, the transfer mechanism 31a does not necessarily have the illustrated articulated type, and may have another type such as a frog leg type, a linear type, or the like.

The aligner 32a has a driving mechanism 71, a driving shaft 72, a substrate support portion 73, and an optical sensor 74. In the container 30a, the aligner 32a is disposed near the loading port of the process module to which the substrate W is transferred by the transfer mechanism 31a. In this example, the aligner 32a is disposed near the loading port of the process module PM1.

The driving mechanism 71 is disposed below the container 30a and has the driving shaft 72 extending vertically upward into the container 30a. The driving mechanism 71 is configured to rotate and vertically move the drive shaft 72. The substrate support portion 73 is disposed at an upper end of the driving shaft 72, and is provided with three substrate support pins (only two are shown) 73a for supporting the substrate W.

Figure 6:
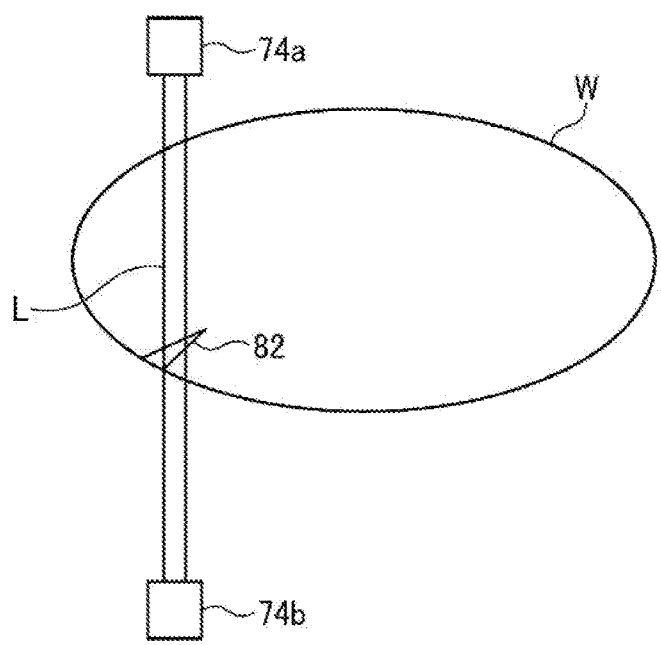
FIG. 6 explains a notch position detection method using an optical sensor in an aligner.

The optical sensor 74 has a light emitting part 74a and a light receiving part 74b, and detects the notch position of the substrate W when the light from the light emitting part 74a is received by the light receiving part 74b. In other words, when the substrate W is rotated while being supported by the substrate support portion 73, light L emitted from the light emitting part 74a is received by the light receiving part 74b when the notch 82 of the substrate W reaches a position corresponding to the light L as shown in FIG. 6. Accordingly, the notch position of the substrate W is detected. A detection signal obtained when the light is received by the light receiving part 74b is transmitted to the controller 4, and the alignment of the substrate W is performed based on the detection signal. Further, the eccentricity of the substrate W from the position where the light L passes through the notch 82 can be corrected. In addition, a vacuum bellows 75 is disposed between the bottom surface of the bottom wall of the container 30a and the driving mechanism 71.

Figure 7A:
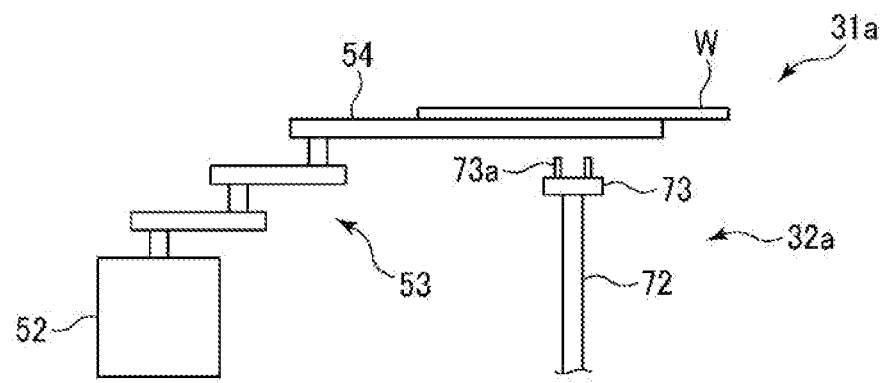
FIG. 7A explains transfer of a substrate from the transfer mechanism in the transfer module to the aligner.
Figure 7B:
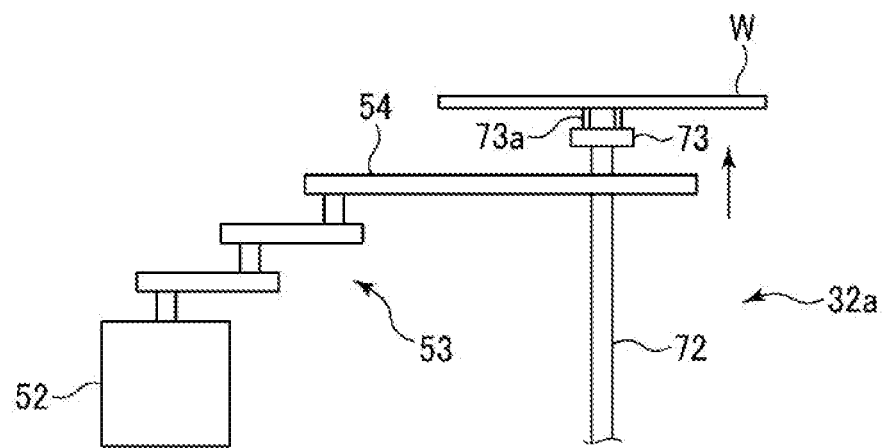
FIG. 7B explains transfer of a substrate from the transfer mechanism in the transfer module to the aligner.

The substrate W can be transferred from the transfer mechanism 31a to the aligner 32a as shown in FIGS. 7A and 7B. In other words, first, as shown in FIG. 7A, in a state where height positions of the substrate support pins 73a of the substrate support portion 73 are lower than the height position of the substrate W supported by the substrate support arm 54, the substrate W supported by the support arm 54 is transferred to a position directly above the substrate support portion 73. Next, as shown in FIG. 7B, the driving mechanism 71 raises the substrate support portion 73 via the driving shaft 72 so that the substrate W can be received on the substrate support pins 73a. The transfer of the substrate W from the aligner 32a to the transfer mechanism 31a may be realized by performing the operations illustrated in FIGS. 7A and 7B in the reverse order.

Figure 8:
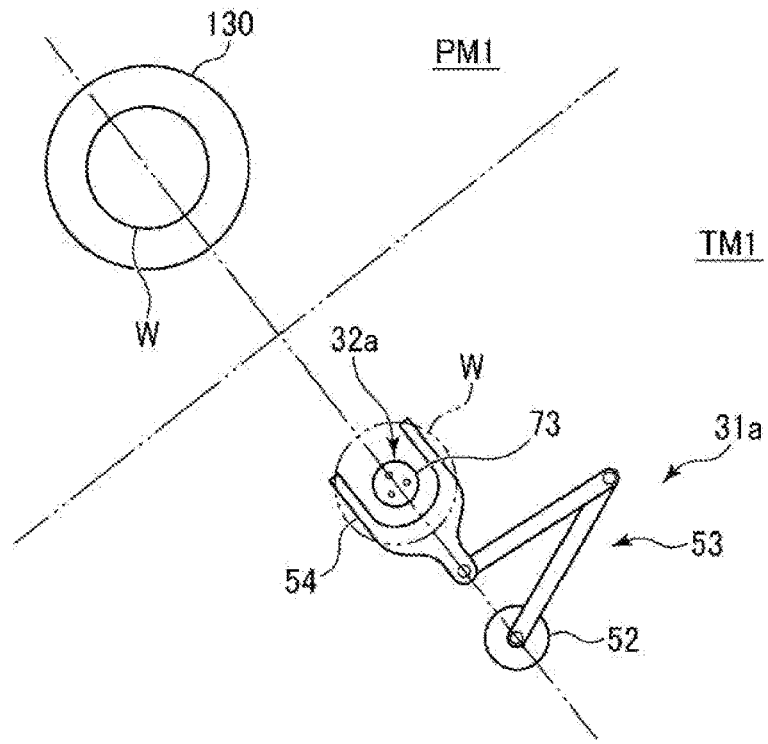
FIG. 8 shows a desired arrangement position of the aligner in the transfer module.

It is preferable that the aligner 32a is disposed at a position where the operation of receiving the substrate W from the transfer mechanism 31a and transferring the aligned substrate W to the process module PM1 can be effectively performed. From the above, it is preferable that the aligner 32a is disposed near the loading port of the process module PM1 (see FIG. 1). Further, as shown in FIG. 8, it is preferable that the aligner 32a is disposed on a transfer path on which the transfer mechanism 31a of the transfer module TM1 accesses the substrate holder of the process module PM1 connected to the transfer module TM1. Specifically, in the example of FIG. 8, the aligner 32a is disposed on a line that connects the rotation center of the transfer mechanism 31a (the portion of the driving shaft 51a corresponding to the center of the base portion 52) and the center of the substrate holder 130 of the process module PM1. Accordingly, it is possible to minimize a transfer route in which the substrate W is transferred to the aligner and then loaded into the process module PM1 and transferred to the substrate holder 130 by the transfer mechanism 31a. This is also applied to the aligners 32b, 32c and 32d. In the example of FIG. 8, the aligner 32a is disposed near the loading port of the process module PM1.

(Operation of Substrate Processing System)

Next, the operation in the substrate processing system 1 configured as described above will be described.

First, the substrate W is taken out from the FOUP 20 on the load port 22 and transferred to the load-lock module LLM1 by the transfer device 24. In this case, the load-lock module LLM1 is maintained in an atmospheric pressure state, and is evacuated after the substrate W is received.

Then, the substrate W is unloaded from the load-lock module LLM1 by the transfer mechanism 31a of the transfer module TM1 in the transfer part 12. The unloaded substrate W is transferred to the aligner 32a by the transfer mechanism 31a and aligned by the aligner 32a. Then, the aligned substrate W is transferred to the process module PM1 by the transfer mechanism 31a.

In the process module PM1, the gate valve G is opened, and the substrate W supported by the substrate support arm 54 of the transfer mechanism 31a is loaded into the processing chamber 101 through the loading/unloading port 103 and held on the substrate holder 130. In this case, the substrate holder 130 is located at the position shown in FIG. 3. Then, the gate valve G is closed, and the inside of the processing chamber 101 is evacuated by the vacuum pump 153 of the exhaust 150. Next, the gas supplier 160 introduces an inert gas, e.g., Ar gas, and controls a pressure in the processing chamber 101 to a desired vacuum level. If necessary, a temperature of the substrate W is adjusted to a predetermined temperature by the temperature controller of the substrate holder 130.

Next, a desired target 112 is selected from the plurality of targets 112 and subjected to sputtering film formation. During the sputtering film formation, other targets except the selected target are shielded by the shutter 120. When the sputtering film formation is performed, a power is supplied to the selected target 112 from the corresponding power supply 113 through the corresponding target electrode 112 while rotating the substrate holder 130 by the driving mechanism 132. In this case, the cathode magnets 114 are driven by the magnet driving parts 115. Accordingly, high-density plasma is generated from the inert gas (Ar gas) by the electric field generated by the voltage applied to the target 112 and the magnetic field generated by the cathode magnets 114. The target 112 is sputtered by the plasma thus generated, and sputtered particles are released. These sputtered particles are deposited on the substrate W to form a desired film.

In the case of forming a magnetic film, when the substrate W aligned by the aligner 32a is loaded, the direction of the magnetic field of the ring magnet 140 is adjusted in advance to form a specific angle corresponding to the magnetic film to be formed with respect to the notch of the substrate W. Then, the ring magnet 140 is placed on the substrate holder 130 by aligning the positions of the magnet support 135 and the protrusion 136, and the substrate holder 130 is located at the height position shown in FIG. 2. Then, the sputtering film formation is performed while rotating the ring magnet 140 together with the substrate holder 130.

In the case of forming a non-magnetic film, the substrate holder 130 and the ring magnet 140 are located at the height positions illustrated in FIG. 3, and the sputtering film formation is performed in a state where the magnetic field of the ring magnet 140 does not affect the substrate W. In this case, the ring magnet 140 is not placed on the substrate holder 130, and only the substrate holder 130 is rotated.

In the process module PM1, a plurality of films can be formed to correspond to a plurality of targets 112. Further, a single film may be formed using the plurality of targets 112 made of the same material. In other words, in the process module PM1, one or multiple predetermined films are formed on the substrate W by sputtering.

After the sputtering film formation in the process module PM1 is completed, the gate valve G on the unloading side of the process module PM1 is opened, and the substrate W is unloaded by the transfer mechanism 31b of the transfer module TM2. The unloaded substrate W is transferred to the aligner 32b by the transfer mechanism 31b and aligned by the aligner 32b, and then transferred to the process module PM3 by the transfer mechanism 31b. In the process module PM3, similarly to the process module PM1, one or multiple predetermined films are formed on the substrate W by sputtering.

After the sputtering film formation in the process module PM3 is completed, the gate valve G on the unloading side of the process module PM3 is opened, and the substrate W is unloaded by the transfer mechanism 31c of the transfer module TM3. The unloaded substrate W is transferred to the aligner 32c by the transfer mechanism 31c and aligned by the aligner 32c, and then transferred to the process module PM5 by the transfer mechanism 31c. In the process module PM5, for example, similarly to the process module PM1, one or multiple predetermined films are formed on the substrate W by sputtering.

After the sputtering film formation in the process module PM5 is completed, the gate valve G on the unloading side of the process module PM5 is opened, and the substrate W is unloaded by the transfer mechanism 31d of the transfer module TM4. The unloaded substrate W is transferred to the aligner 32d by the transfer mechanism 31d and aligned by the aligner 32d, and then transferred to the process module PM7 by the transfer mechanism 31d. In the process module PM7, for example, similarly to the process module PM1, one or multiple predetermined films are formed on the substrate W by sputtering.

After the sputtering film formation in the process module PM7 is completed, the gate valve G on the unloading side of the process module PM7 is opened, and the substrate W is unloaded by the transfer mechanism 31d of the transfer module TM4. The unloaded substrate W is transferred to the aligner 32d by the transfer mechanism 31d and aligned (by the aligner 32d), and then transferred to the process module PM8 by the transfer mechanism 31d. In the process module PM8, for example, similarly to the process module PM1, one or multiple predetermined films are formed on the substrate W by sputtering.

Then, the substrates W are sequentially transferred to the process modules PM6, PM4, and PM2 by the transfer mechanisms 31c, 31b, and 31a of the transfer modules TM3, TM2, and TM1 through the aligners 32c, 32b, and 32a, respectively, and subjected to the same sputtering film formation as that performed in the process module PM1.

After the processing in the process module PM2 is completed, the substrate W is transferred to the load-lock module LLM2 by the transfer mechanism 31a. In this case, the load-lock module LLM2 is in a vacuum state, and opened to the atmosphere after the wafer W is received. Then, the substrate W in the load-lock module LLM2 is transferred into the FOUP 20 of the load port 22 by the transfer device 24.

In this manner, the substrates W can be sequentially and serially transferred to the plurality of process modules in a U-shape and subjected to a series of film forming processes.

The above-described series of processes are repeatedly and simultaneously performed on a plurality of wafers W. In this case, the delivery parts 41, 42, and 43 function as transfer buffers where the substrates W temporarily stand by when the access of the transfer mechanisms 31a to 31d is delayed.

In the process modules PM1 to PM8, the plurality of targets 112 of some process modules may be non-magnetic. In that case, the ring magnet 140 is unnecessary. Further, it is not necessary that all the process modules PM1 to PM8 are film forming apparatuses for performing sputtering film formation. For example, the process module PM1 may be used as a pre-cleaning apparatus. Further, when it is necessary to form an oxide film, some of the process modules may be used as film forming apparatuses having therein an oxidation mechanism, or some other process modules may be dedicated to oxidation treatment.

Figure 9:
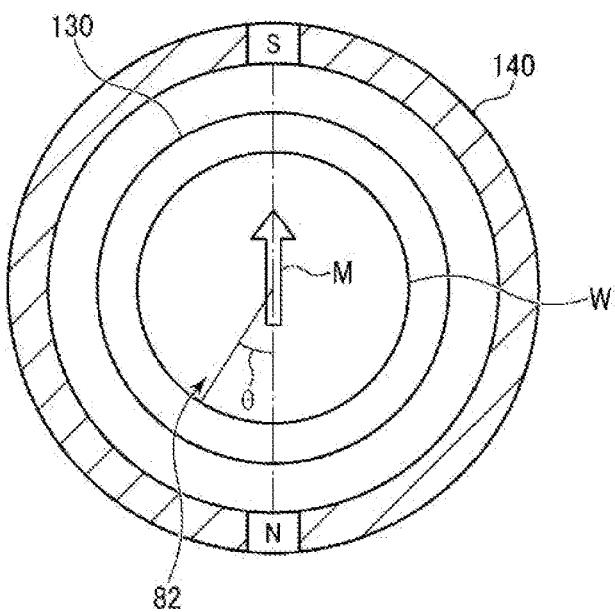
FIG. 9 explains a relationship between a direction of a magnetic field of a ring magnet and a notch position of a substrate in the case of forming a magnetic film in the process module.

In the case of manufacturing a multilayer film including a plurality of magnetic films such as a head of a hard disk drive (HDD) using the substrate processing system 1, it is necessary to control an angle of a substrate on which a film will be formed. In other words, in the case of forming a magnetic film using the ring magnet 140, as shown in FIG. 9, a direction M of the magnetic field generated by the ring magnet 140 and an angle $\theta$ of the position of the notch 82 of the substrate W are different depending on materials, so that it is necessary to adjust the angle $\theta$ to a specific angle depending on the material of the magnetic film. Therefore, it is necessary to align the substrate W at the time of transferring the substrate to the process module. Further, even when it is not necessary to adjust the angle of the substrate W, it may be necessary to correct the position of the substrate W to improve the stability of the transfer accuracy of the substrate W.

In the processing system for performing serial transfer disclosed in Patent Document 2, the aligner is disposed in the atmospheric transfer chamber, so that the transfer of the substrate becomes extremely complicated in the case aligning the substrate whenever the substrate is transferred to the plurality of process modules. Further, although it may be considered that the delivery part between the transfer modules serves as the aligner, the transfer of the substrate becomes complicated in this case as well. Therefore, it is difficult to maintain a high productivity in both cases.

On the other hand, in the present embodiment, the aligners 32a, 32b, 32c, and 32d are respectively disposed in the plurality of transfer modules TM1 to TM4 having the transfer mechanisms, and the alignment of the substrate W transferred to the process module connected to each transfer module was performed by the aligner of the corresponding transfer module. Accordingly, even when the substrate W is aligned whenever the substrate W is transferred to each process module, it is not necessary to transfer the substrate W to the outside of the corresponding transfer module in order to perform the alignment, which makes it possible to maintain a high productivity.

Further, it is preferable that the aligners 32a, 32b, 32c, and 32d are disposed near the loading port of the process module to which the substrate W will be transferred (see FIG. 1). Accordingly, the aligned substrate W can be efficiently transferred to the corresponding process module. Further, it is preferable that the aligners 32a, 32b, 32c and 32d are disposed on the path where the substrate W is transferred to the corresponding process modules by the corresponding transfer mechanisms 31a, 31b, 31c and 31d (see FIG. 8). Hence, it is possible to effectively perform the operation in which the transfer mechanisms 31a, 31b, 31c, and 31d deliver the substrates W to the aligners 32a, 32b, 32c, and 32d and transfer the aligned substrates W to the process modules PM1, PM3, PM5, and PM7. As a result, the productivity can be further improved. Specifically, as described above with reference to FIG. 8, it is preferable that the aligner 32a is disposed on a line that connects the rotation center of the transfer mechanism 31a and the center of the substrate holder 130 of the process module PM1 that is the transfer destination. Accordingly, it is possible to minimize the transfer route in which the substrate W is transferred to the aligner 32a, and then loaded into the process module PM1 and transferred to the substrate holder 130 by the transfer mechanism 31a. This is also applied to the aligners 32b, 32c and 32d.

Second Embodiment

Next, a second embodiment will be described.

Figure 10:
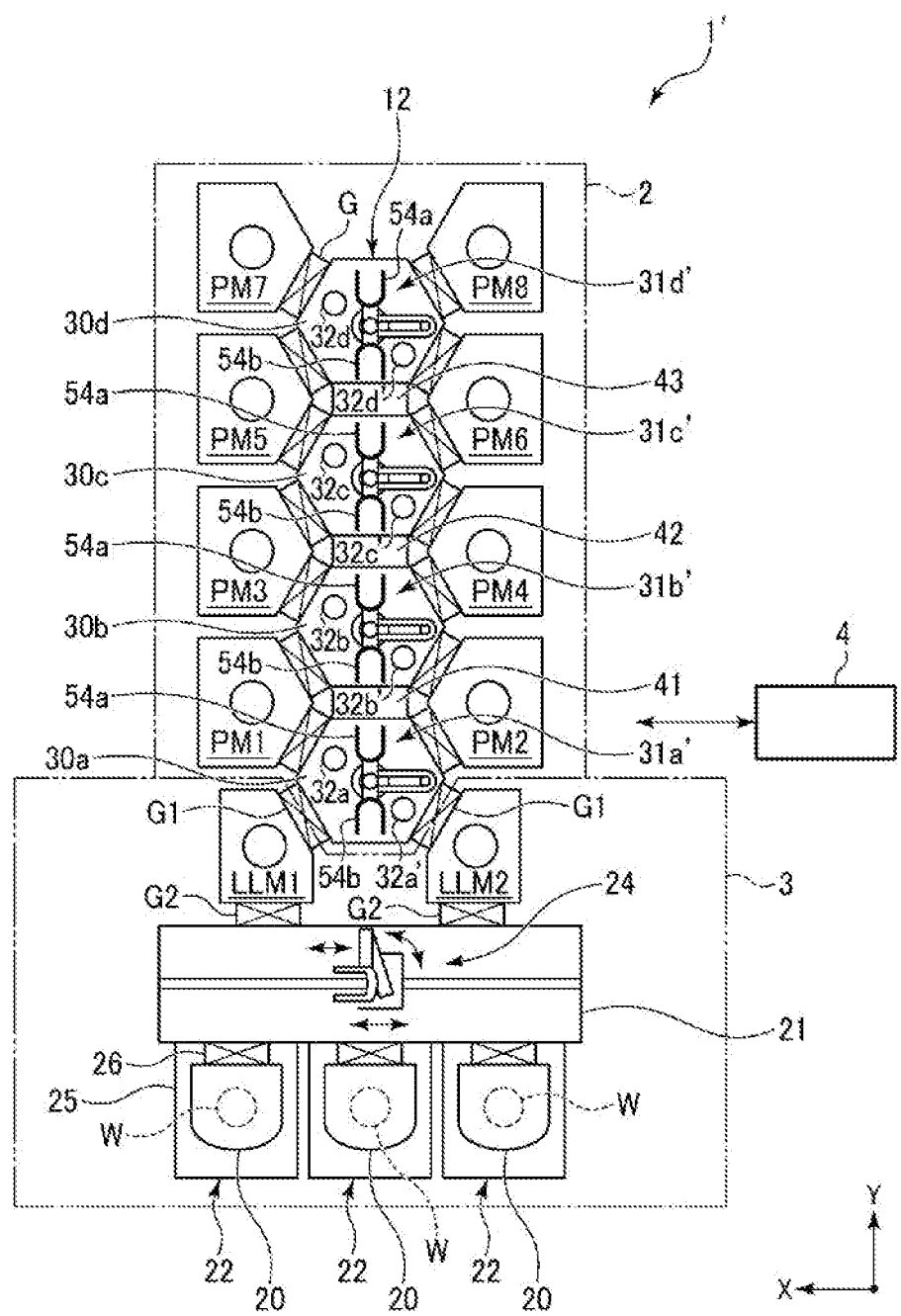
FIG. 10 a plan view schematically showing a substrate processing system according to a second embodiment.

FIG. 10 is a plan view schematically showing a substrate processing system according to the second embodiment.

The substrate processing system 1' of the present embodiment basically has the same configuration as that of the substrate processing system 1 of the first embodiment, and includes four transfer modules TM1 to TM4 and eight process modules PM1 to PM8. However, in the substrate processing system 1', each of the transfer modules TM1, TM2, TM3, and TM4 has transfer mechanism 31a', 31b', 31c', and 31d', each having two substrate support arms 54a and 54b, instead of the transfer mechanisms 31a, 31b, 31c, and 31d of the first embodiment. With such a configuration of the transfer mechanism, the substrates W can be transferred simultaneously by the two substrate support arms 54a and 54b, so that the productivity can be further improved. For example, the two substrate support arms 54a and 54b can simultaneously load or unload the substrates into or from two process modules. Specifically, for example, in the transfer module TM2, the substrate W can be transferred to the process module PM3 by the substrate support arm 54a of the transfer mechanism 31b' and, at the same time, the substrate W can be transferred to the process module PM2 by the substrate support arm 54b.

Further, in the substrate processing system 1' of the present embodiment, the transfer modules TM1, TM2, TM3, and TM4 have aligners 32a', 32b', 32c', and 32d' in addition to the aligners 32a, 32b, 32c, and 32d that are the same as those of the first embodiment. The aligners 32a, 32b, 32c, and 32d are used to align the substrates W at the time of loading the substrates W into the process modules PM1, PM3, PM5, and PM7 by the substrate support arms 54a of the transfer mechanisms 31a', 31b', 31c', and 31d', respectively. On the other hand, the aligners 32a', 32b', 32c', and 32d' are used to align the substrates W at the time of loading the substrates W into the process modules PM6, PM4, and PM2, and the load-lock module LLM2 by the substrate support arms 54b of the transfer mechanisms 31a', 31b', 31c', and 31d', respectively.

It is preferable that the aligners 32a', 32b', 32c', and 32d' are disposed near the loading ports of the process modules to which the substrates W will be transferred and disposed on the path where the substrates W are transferred to the corresponding transfer modules by the corresponding transfer mechanisms 31a', 31b', 31c', and 31d'. Accordingly, it is possible to effectively perform the operation in which the transfer mechanisms 31a', 31b', 31c', and 31d' deliver the substrates W to the aligners 32a', 32b', 32c', and 32d', and transfer the aligned substrates W to the process modules PM6, PM4, and PM2 and the load-lock module LLM2. Hence, the productivity can be further improved. More specifically, similarly to the aligner 32a described with reference to FIG. 8, the aligners 32a', 32b', 32c', and 32d' are disposed on the line that connects the rotation centers of the transfer mechanisms 31a', 31b', 31c', and 31d' and the center of the substrate holder that is the transfer destination. Accordingly, it is possible to minimize the transfer route where the substrates W are transferred to the aligners 32a', 32b', 32c', and 32d', and then loaded into the load-lock module LLM2 and the process module PM2, PM4, and PM6 and transferred to the substrate holders by the transfer mechanism 31a', 31b', 31c', and 31d'.

Other Applications

While the embodiments have been described, it should be noted that the above-described embodiments are illustrative in all respects and are not restrictive. The above-described embodiments may be omitted, replaced, or changed in various forms without departing from the scope of the appended claims and the gist thereof.

For example, the substrate processing system 1 of the embodiment is merely an example and may be modified as long as a plurality of substrates is serially transferred to a plurality of process modules connected to a plurality of transfer modules and processed. Further, in the above embodiment, a plurality of substrates are serially transferred in a U shape. However, the present disclosure is not limited thereto. Further, in the above embodiment, the case of manufacturing the head of the hard disk drive has been described as an example. However, the present disclosure is not limited thereto, and may also be applied to the case of manufacturing a multilayer film including another magnetic film. In addition, the processing is not limited to sputtering film formation.

DESCRIPTION OF REFERENCE NUMERALS

1: substrate processing system
2: processing part
3: loading/unloading part
4: controller
12: transfer part
20: FOUP
22: load port
24: transfer device
30a, 30b, 30c, 30d: container
31a, 31b, 31c, 31d, 31a', 31b', 31c', 31d': transfer mechanism
32a, 32b, 32c, 32d, 32a', 32b', 32c', 32d': aligner
101: processing chamber
112: target
113: power supply
130: substrate holder
140: ring magnet
LLM1, LLM2: load-lock module
PM1 to PM8: process module
TM1 to TM4: transfer module
W: substrate

The invention claimed is:
1. A substrate processing system comprising:
a plurality of transfer modules having transfer mechanisms configured to transfer substrates; and a plurality of process modules connected to the plurality of transfer modules,
wherein at least one of the plurality of process modules is a film forming apparatus for performing sputtering film formation on a substrate,
wherein the at least one of the plurality of process modules performs the sputtering film formation of a magnetic film by sputtering plasma to a magnetic target while applying a magnetic field using a ring magnet disposed around the substrate,
wherein the transfer mechanisms of the plurality of transfer modules transfer a plurality of substrates sequentially and serially to the plurality of process modules, and
each of the plurality of transfer modules has an aligner contained within the transfer module that is configured to align a substrate when transferring the substrate to one of the plurality of process modules,
wherein, in each of the transfer modules, the aligner that is contained within the transfer module is disposed on a transfer path of the transfer mechanism when transferring the substrate to a substrate holder of one of the plurality of process modules and the aligner is disposed on a straight line that connects a rotation center of the transfer mechanism and a center of the substrate holder of one of the plurality of process modules,
wherein the aligner is configured to detect a position of a notch of the substrate based on light emitted by a light emitting device being received by a light receiving device, and a direction of the magnetic field of the ring magnet and an angle of the notch formed at the substrate are adjusted to a predetermined angle in the at least one of the plurality of process modules based on a detected notch position.

2. The substrate processing system of claim 1, wherein the process modules are arranged on one side and the other side, opposite to the one side, of the transfer modules, and the substrates are transferred in a U shape in which the substrates are sequentially and serially transferred in one direction to the process modules arranged on said one side, and then sequentially transferred in the opposite direction to the process modules arranged on the other side.

3. The substrate processing system of claim 2, wherein each of the transfer mechanisms has two substrate support arms, and one of the substrate support arms transfers a substrate to one of the process modules arranged on said one side, and the other substrate support arm transfers another substrate to one of the process modules arranged on the other side.

4. The substrate processing system of claim 3, wherein each of the plurality of transfer modules has two aligners, and one of the aligners is used when one of the substrate support arms transfers the substrate to one of the process modules arranged on said one side, and the other aligner is used when the other substrate support arm transfers said another substrate to one of the process modules arranged on the other side.

5. A substrate processing method comprising:
preparing a substrate processing system including a plurality of transfer modules having transfer mechanisms configured to transfer substrates and a plurality of process modules connected to the plurality of transfer modules, wherein at least one of the plurality of process modules is a film forming apparatus for performing sputtering film formation on a substrate and the at least one of the plurality of process modules performs the sputtering film formation of a magnetic film by sputtering plasma to a magnetic target while applying a magnetic field using a ring magnet disposed around the substrate;
sequentially and serially transferring the substrates to the plurality of process modules by the transfer mechanisms respectively disposed in the transfer modules;
aligning a substrate by an aligner contained within a transfer module from the plurality of transfer modules at the time of transferring the substrate to one of the plurality of process modules by the transfer mechanism in each of the transfer modules; and
processing the substrates in the plurality of process modules,
wherein the alignment by the aligner that is contained within the transfer module is performed in a state where the aligner is disposed on a transfer path of the transfer mechanism at the time of transferring the substrate to a substrate holder of one of the plurality of process modules and the alignment is performed in a state where the aligner is disposed on a straight line that connects a rotation center of the transfer mechanism and a center of the substrate holder of one of the plurality of process modules,
wherein a position of a notch of the substrate is detected by the aligner based on light emitted by a light emitting device being received by a light receiving device, and a direction of the magnetic field of the ring magnet and an angle of the notch formed at the substrate are adjusted to a predetermined angle in the at least one of the plurality of process modules based on a detected notch position.

6. The substrate processing method of claim 5, wherein the plurality of process modules are arranged on one side and the other side, opposite to the one side, of the transfer modules, and
the sequential and serial transfer of the plurality of substrates to the plurality of process modules is performed in a U shape by sequentially and serially transferring substrates in one direction to the process modules arranged on said one side and then sequentially and serially transferring the substrates in a reverse direction to the process modules arranged on the other side.

7. The substrate processing method of claim 6, wherein each of the transfer mechanisms has two substrate support arms, and one of the substrate support arms transfers a substrate to one of the process modules arranged on said one side, and the other substrate support arm transfers another substrate to one of the process modules arranged on the other side.

8. The substrate processing method of claim 7, wherein each of the plurality of transfer modules has two aligners, and one of the aligners is used when one of the substrate support arms transfers the substrate to one of the process modules arranged on said one side, and the other aligner is used when the other substrate support arm transfers said another substrate to one of the process modules arranged on the other side.

* * * * *